United States Patent
Scheuerlein et al.

(10) Patent No.: US 6,661,730 B1
(45) Date of Patent: Dec. 9, 2003

(54) PARTIAL SELECTION OF PASSIVE ELEMENT MEMORY CELL SUB-ARRAYS FOR WRITE OPERATION

(75) Inventors: Roy E. Scheuerlein, Cupertino, CA (US); Matthew P. Crowley, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 241 days.

(21) Appl. No.: 09/748,649

(22) Filed: Dec. 22, 2000

(51) Int. Cl.$^7$ .................................................. G11C 8/00
(52) U.S. Cl. ............................ 365/230.03; 365/189.01; 365/230.06
(58) Field of Search ....................... 365/230.03, 189.01, 365/230.06

(56) References Cited

U.S. PATENT DOCUMENTS

| | | | |
|---|---|---|---|
| 3,576,549 A | 4/1971 | Hess et al. .............. | 340/173 SP |
| 3,582,908 A | 6/1971 | Koo ........................... | 340/173 |
| 3,634,929 A | 1/1972 | Yoshida et al. ............... | 29/577 |
| 3,671,948 A | 6/1972 | Cassen et al. ......... | 340/173 SP |
| 3,717,852 A | 2/1973 | Abbas et al. .......... | 340/173 SP |
| 3,728,695 A | 4/1973 | Frohman-Bentchkowsky ........ | 340/173 R |
| 3,787,822 A | 1/1974 | Riuolt .................... | 340/173 SP |
| 3,863,231 A | 1/1975 | Taylor .................... | 340/173 SP |
| 3,990,098 A | 11/1976 | Mastrangelo .................. | 357/2 |
| 4,146,902 A | 3/1979 | Tanimoto et al. .............. | 357/6 |
| 4,203,123 A | 5/1980 | Shanks ........................... | 357/2 |
| 4,203,158 A | 5/1980 | Frohman-Bentchkowsky et al. ... | 365/185 |
| 4,203,158 A | 5/1980 | Frohman-Bentchkowsky et al. ... | 365/185 |

(List continued on next page.)

OTHER PUBLICATIONS

"TH58512FT Toshiba MOS Digital Integrated Circuit Silicon Gate CMOS" datasheet, 1999, 34 pp.

Mustapha Charara, "SDRAM: The Wave of the Future," [online] [printed on Oct. 30, 1998] Retrieved from the Internet <URL: http://www.sysfix.com/sdram.htm>, 3 pages.

Warmke, Rich, "Designing a Multimedia Subsystem with Rambus DRAMs," Multimedia Systems Design, Miller Freeman, Inc., Mar. 1998, 9 pp.

U.S. App. No. 09/560,626, filed Apr. 28, 2000, entitled "Three-Dimensional Memory Array and Method of Fabrication," naming inventor N. Johan Knall, 48 pp.

U.S. App. No. 09/747,574, filed Dec. 22, 2000, entitled "Three-Dimensional Memory Array and Method for Storing Data Bits and ECC Bits Therein," naming inventors Thomas H. Lee, James M. Cleeves and Mark G. Johnson, 18 pp.

Primary Examiner—Richard Elms
Assistant Examiner—Tuan T. Nguyen
(74) Attorney, Agent, or Firm—Zagorin, O'Brien & Graham LLP (57) ABSTRACT

A memory array is subdivided into many sub-arrays which are separately selectable in groups, with each group containing one or more sub-arrays. The various data bits of a data set are physically spread out and mapped into a large number of associated sub-array groups. All the associated sub-array groups are preferably selected during a read cycle to simultaneously read the various bits of the data set, but when writing the data set, a smaller number of sub-array groups are activated during each of several write cycles to simultaneously write only a portion of the data set. Consequently, the read bandwidth remains high and is driven by the number of bits simultaneously read, but the write power is reduced since during each write cycle fewer bits are written. Such a memory array is particularly advantageous with passive element memory cells, such as those having antifuses.

62 Claims, 7 Drawing Sheets

U.S. PATENT DOCUMENTS

| | | | |
|---|---|---|---|
| 4,229,757 A | 10/1980 | Moussie | 357/59 |
| 4,272,880 A | 6/1981 | Pashley | 29/571 |
| 4,281,397 A | 7/1981 | Neal et al. | 365/189 |
| 4,419,741 A | 12/1983 | Stewart et al. | 365/72 |
| 4,420,766 A | 12/1983 | Kasten | 357/59 |
| 4,442,507 A | 4/1984 | Roesner | 365/100 |
| 4,489,478 A | 12/1984 | Sakurai | 29/574 |
| 4,494,135 A | 1/1985 | Moussie | 357/59 |
| 4,498,226 A | 2/1985 | Inoue et al. | 29/576 B |
| 4,499,557 A | 2/1985 | Holmberg et al. | 365/163 |
| 4,507,757 A | 3/1985 | McElroy | 365/104 |
| 4,543,594 A | 9/1985 | Mohsen et al. | 357/51 |
| 4,569,121 A | 2/1986 | Lim et al. | 29/574 |
| 4,646,266 A | 2/1987 | Ovshinsky et al. | 365/105 |
| 4,820,657 A | 4/1989 | Hughes et al. | 437/172 |
| 4,823,181 A | 4/1989 | Mohsen et al. | 357/51 |
| 4,855,953 A | 8/1989 | Tsukamoto et al. | 365/149 |
| 4,876,220 A | 10/1989 | Mohsen et al. | 437/170 |
| 4,881,114 A | 11/1989 | Mohsen et al. | 357/54 |
| 4,899,205 A | 2/1990 | Hamdy et al. | 357/51 |
| 4,922,319 A | 5/1990 | Fukushima | 357/51 |
| 4,943,538 A | 7/1990 | Mohsen et al. | 437/52 |
| 5,070,383 A | 12/1991 | Sinar et al. | 357/51 |
| 5,070,384 A | 12/1991 | McCollum et al. | 357/51 |
| 5,126,290 A | 6/1992 | Lowrey et al. | |
| 5,297,148 A | 3/1994 | Harari et al. | |
| 5,306,935 A | 4/1994 | Esquivel et al. | 257/316 |
| 5,311,039 A | 5/1994 | Kimura et al. | 257/50 |
| 5,313,425 A | 5/1994 | Lee et al. | 365/201 |
| 5,334,880 A | 8/1994 | Abadeer et al. | 307/219 |
| 5,391,518 A | 2/1995 | Bhushan | 437/190 |
| 5,427,979 A | 6/1995 | Chang | 437/190 |
| 5,441,907 A | 8/1995 | Sung et al. | 437/48 |
| 5,463,244 A | 10/1995 | De Araujo et al. | 257/530 |
| 5,535,156 A | 7/1996 | Levy et al. | 365/175 |
| 5,536,968 A | 7/1996 | Crafts et al. | 257/529 |
| 5,675,547 A | 10/1997 | Koga | 365/230.03 |
| 5,737,259 A | 4/1998 | Chang | 365/105 |
| 5,745,407 A | 4/1998 | Levy et al. | 365/159 |
| 5,751,012 A | 5/1998 | Wolstenholme et al. | 257/5 |
| 5,776,810 A | 7/1998 | Guterman et al. | 438/258 |
| 5,798,968 A | 8/1998 | Lee et al. | |
| 5,835,396 A | 11/1998 | Zhang | 365/51 |
| 5,883,409 A | 3/1999 | Guterman et al. | 257/316 |
| 5,890,192 A | 3/1999 | Lee et al. | |
| 5,901,105 A | 5/1999 | Ong et al. | |
| 6,034,882 A | 3/2000 | Johnson et al. | 365/103 |
| 6,118,707 A * | 9/2000 | Gould et al. | 365/189.08 |
| 6,185,122 B1 | 2/2001 | Johnson et al. | 365/103 |
| 6,240,046 B1 | 5/2001 | Proebsting | |
| 6,243,287 B1 * | 6/2001 | Naffziger et al. | 365/154 |
| 6,278,711 B1 * | 8/2001 | Ganmukhi et al. | 370/395.1 |
| 6,366,526 B2 * | 4/2002 | Naffziger et al. | 365/230.06 |
| 6,438,063 B1 * | 8/2002 | Lee | 365/230.03 |
| 6,462,998 B1 | 10/2002 | Proebsting | |

* cited by examiner

PARTIAL SELECTION OF PASSIVE ELEMENT MEMORY CELL SUB-ARRAYS FOR WRITE OPERATION

BACKGROUND OF THE INVENTION

1. Field of the Invention

The present invention relates to semiconductor memory arrays, and particularly relates to those memory arrays incorporating passive element memory cells.

2. Description of the Related Art

Integrated circuits incorporating a memory array usually subdivide the array into a sometimes large number of sub-arrays. As used herein, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. As yet another example, in some memory technologies the memory array is divided into sub-arrays to ensure that some of the memory array is available for internal refresh operations.

With most memory technologies, the active or selected bits during a particular cycle tend to be very localized, frequently within a single sub-array which is selected during the particular cycle. In a dynamic memory device (e.g., a DRAM device) all of the memory cells along a selected word line are destructively accessed during an active cycle. Consequently, all of the memory cells read during a given cycle usually share the same word line in the same sub-array and are thus very localized. Since the memory cells are destructively read during the cycle, all of the memory cells to be written during a given cycle are usually written into memory cells along the same word line in the same sub-array. Those memory cells which are read during a read cycle traditionally are likewise all written (or at least available to be written) during a write cycle.

Many devices utilizing flash EEPROM technology include a large register which receives data from the external interface, and when a sufficiently large number of bits of data have been communicated to the device, the bits are written in pages into the main memory array of the device. It is essential to the cell simplification of flash EPROM technology to program and erase simultaneously to groups of memory cells that are all located in one sub-array of the memory since data is written from the page into such a cluster of cells and is read from this cluster of cells.

Lastly, as yet another example, Ferro-Electric memory devices also are organized to access all of the memory cells along a selected word line during both a read or a write cycle. Consequently, all of the bits read or written during a given cycle are traditionally clustered in one or a small number of sub-arrays.

Integrated circuits incorporating a passive element memory array require a high-voltage and high-current programming voltage source due to the large number of leakage paths in the array and the high voltage required to program the element conductivity. If provided on chip, the area required by such on-chip circuitry to generate the programming voltage source is substantial. It is not unusual to consume 10 to 30% of the chip area for such on-chip programming voltage sources (e.g., charge pumps). Since many types of passive element memory arrays are write once memory arrays, the read bandwidth is frequently of greater significance than the write bandwidth. There remains a need for improved architectures and methods of operation to decrease programming power without decreasing the read bandwidth of such memories.

SUMMARY OF THE INVENTION

Traditional memory architectures provide for selecting the same portion of the memory array irrespective of whether a read cycle or a write cycle is performed. Since the selected memory cells corresponding to the data being read or written during a given cycle are usually very tightly clustered, one (or possibly a small number) or sub-arrays are activated in a given cycle for both read and write cycles.

In accordance with the present invention, the bits read during a single read operation may be physically spread out into a large number of sub-arrays. All such sub-arrays are activated (or selected) during a read operation, but a smaller number of sub-arrays are activated during each of several write cycles. Consequently, the read bandwidth remains high and is driven by the number of bits read at the same time. But the write power is reduced since during each write cycle, a smaller number of bits are written. The present invention is particularly advantageous for use with a passive element memory array. The same programming voltage source may be shared by the various groups of sub-arrays during write cycles rather than requiring a large programming voltage source which would otherwise be necessary if simultaneously programming the same number of bits accessed during a read operation.

In one embodiment a passive element memory array includes many sub-arrays which are separately selectable in groups, each group containing one or more sub-arrays. A small number of the groups, preferably just one, are selected to write data simultaneously into the members of the group. Writing continues by cycling through many of the groups, preferably all of the groups, to complete writing all of the data in a set. To read the data set, all sub-arrays in the same many of the groups are simultaneously accessed. Such data is read therefore at a high data rate desirable for the user of the memory, while the write power is reduced because a smaller number of groups, preferably one, is simultaneously selected for writing.

In another embodiment of the present invention, less than all sub-arrays in the same many of the groups may be simultaneously accessed to read the data set, although a smaller number of groups are simultaneously selected for writing than are selected for reading data in a set.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
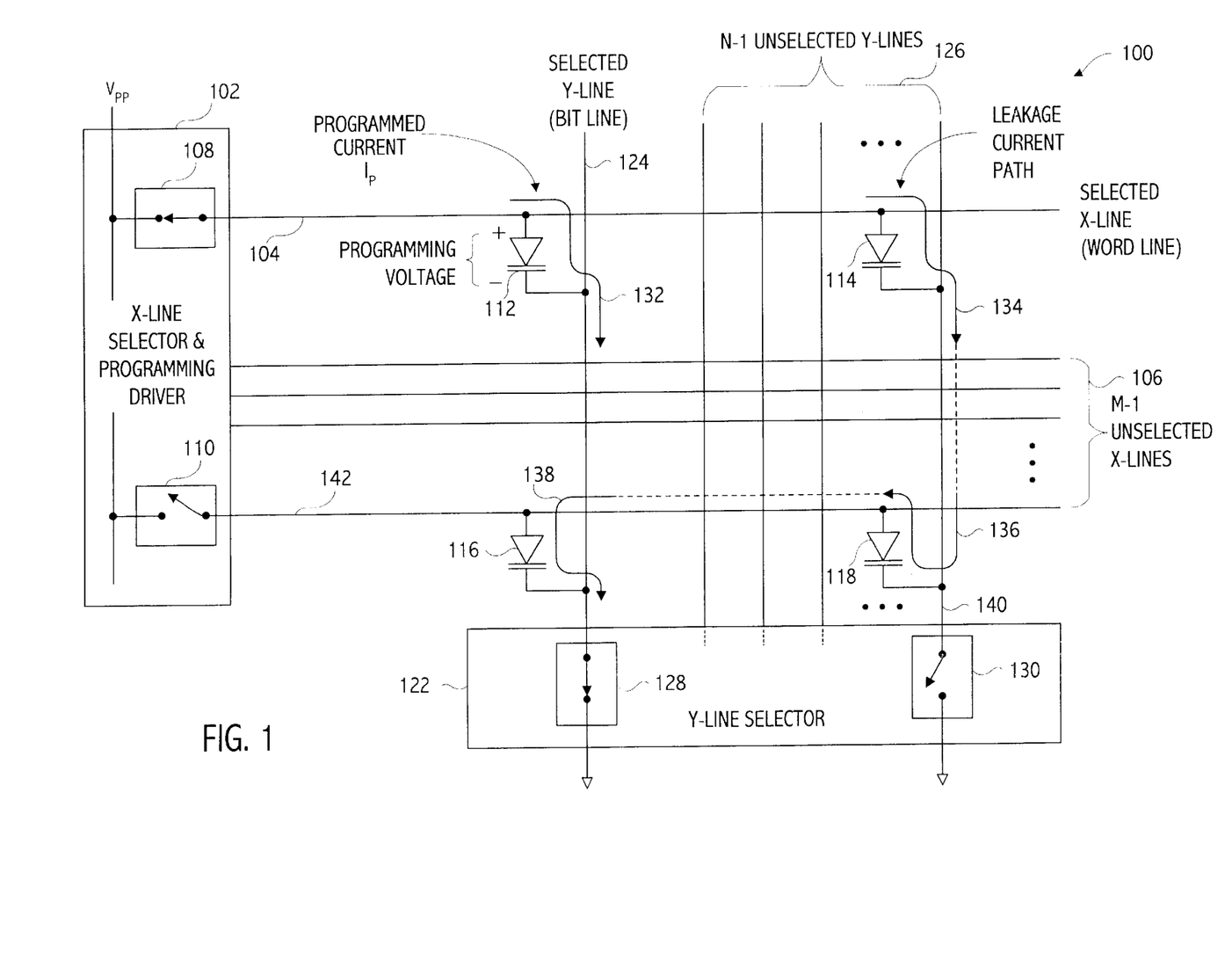
FIG. 1 is a schematic diagram of a passive element memory array for which the present invention is particularly well suited.

Referring now to FIG. 1, a memory sub-array 100 is shown which utilizes passive element memory cells. Each passive element memory cell is preferably a two-terminal memory cell having a steering element in series with a state change element, together connected between one of M possible X-lines (i.e., word lines) and one of N possible Y-lines (i.e., bit lines). These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

An advantageous passive element memory cell is a structure combining an antifuse and a diode in series as the memory cell. Suitable memory cells are described in U.S. Pat. No. 6,034,882 entitled "Vertically Stacked Field Programmable Nonvolatile Memory and Method of Fabrication" which issued on Mar. 7, 2000, and U.S. patent application Ser. No. 09/560,626, filed Apr. 28, 2000, entitled "Three-Dimensional Memory Array and Method of Fabrication," both of which are assigned to the assignee of the present invention and are hereby incorporated by reference in their entirety. One particular memory cell 112 is shown connected between a selected X-line 104 and a selected Y-line 124. To program the memory cell 112, the selected X-line 104 is coupled by driver 108 within the X-line selector 102 to a programming voltage source $V_{pp}$. The magnitude of such a programming voltage source may be 5 to 20 volts, depending upon the structure of the particular memory cell technology incorporated within memory sub-array 100. The selected Y-line 124 is coupled to ground by driver 128 within Y-line selector 122, thus impressing substantially the entire $V_{pp}$ voltage across memory cell 112, which causes the antifuse to "pop" and suddenly become dramatically more conductive. This increased conductivity results in a programmed current $I_p$ (labeled as 132) flowing from the $V_{pp}$ source to ground through the now programmed memory cell 112. The magnitude of the programmed current $I_p$ may frequently reach 100 microamps.

While the memory cell 112 is being programmed, the remaining M−1 unselected X-lines 106 are "floated" by the X-line selector 102, as represented by the programming driver 110 shown as an open switch. Likewise, the N−1 unselected Y-lines 126 are also floated, as represented by the driver 130 within Y-line selector 122, also shown as an open switch. Nonetheless, a significant leakage path exists in parallel with the programming current through memory cell 112 and a leakage current flows potentially throughout the entire memory sub-array 100. Memory cell 114 represents other memory cells connected to the selected X-line 104. A current 134 flows from the selected X-line 104 through each such memory cell 114 to the corresponding Y-line of the particular memory cell. Consider briefly the current 134 flowing into unselected Y-line 140. A reverse biased memory cell 118 (i.e., the steering element within the memory cell being reversed biased) provides a leakage path between unselected Y-line 140 and unselected X-line 142. The current flow through this particular leakage path is labeled 136. Any current finding its way onto unselected X-line 142 will be conducted through memory cell 116 to the selected Y-line 124, which is grounded by the Y-line driver 128. The leakage currents through the remainder of the memory sub-array 100 are highest if virtually all other memory cells have already been programmed. In such a case, memory cell 114, memory cell 118, and memory cell 116 are assumed to have been programmed to a relatively small forward resistance. The magnitude of the leakage current path described thus far is limited by memory cell 118 which is reverse biased, whereas memory cell 114 and memory cell 116 are both forward biased and do little to limit the magnitude of current flow therethrough. Since memory cell 114 represents all other memory cells connected to the selected X-line, there are up to N−1 such memory cells, each of which conducts a certain amount of current from the selected X-line 104 to its corresponding unselected Y-line. Since the memory cell 118 represents those memory cells connected between an unselected Y-line and an unselected X-line, there are (M−1)× (N−1) such memory cells. Similarly, memory cell 116 represents those memory cells connected between an unselected X-line and the selected Y-line. There are M−1 such memory cells analogous to memory cell 116.

In tallying the current flow from the programming voltage source $V_{pp}$ during the programming of selected memory cell 112, the programmed current $I_p$ flows from the selected X-line 104 through the selected memory cell 112, to the selected Y-line 124 (which is grounded). In addition, an effective series circuit is formed by the remainder of the sub-array which includes the parallel combination of N−1 forward biased memory cells (analogous to memory cell 114) in series with the parallel combination of (M−1)×(N−1) reverse biased memory cells (analogous to memory cell 118), in series with the parallel combination of M−1 forward biased memory cells (analogous to memory cell 116). Using values for M and N that may be encountered in practice, a memory sub-array 100 could easily have 1,024 X-lines and 1,024 Y-lines (i.e., M=N=1024). Consequently, the leakage current which the programming voltage source $V_{pp}$ must support in addition to the programmed current itself is the leakage current flowing through one million reverse biased memory cells having programmed antifuses. This can be a substantial amount of current relative to the programmed current itself.

It should be emphasized that there is no real danger of writing the non-selected memory cells because the current paths through the unselected memory cells flow through three devices in series, one of which is reverse biased. The larger problem is the sheer magnitude of the current itself which must be supported by the programming voltage source $V_{pp}$.

Figure 2A:
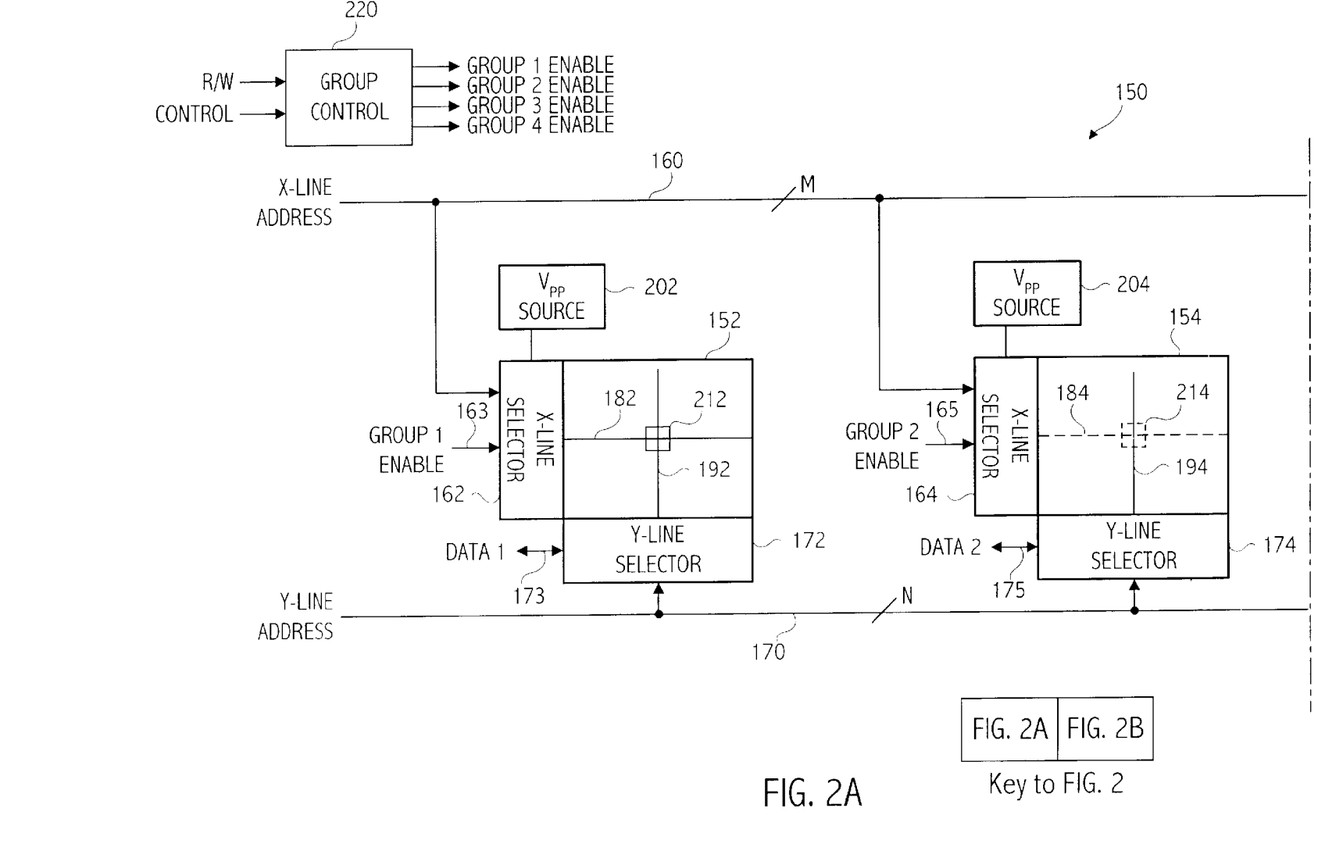
FIG. 2 is a block diagram of a memory array of a preferred embodiment which includes four groups of sub-arrays, each group containing one sub-array.
Figure 2B:
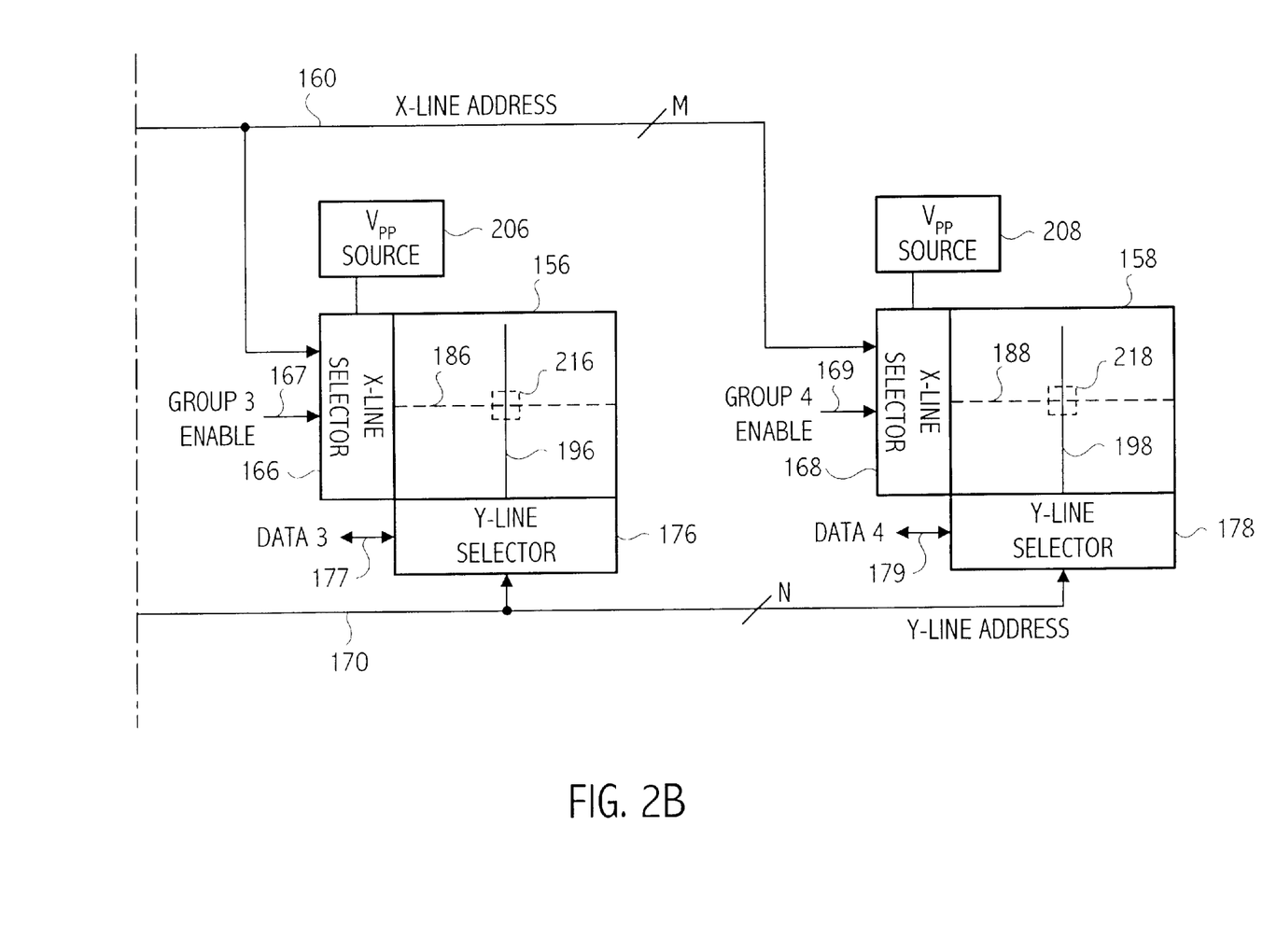

Referring now to FIG. 2, an improved memory array 150 is shown which subdivides the memory array into four groups of sub-arrays, in this case, each group having one sub-array. A first sub-array 152 includes an X-line selector 162 responsive to an X-line address conveyed on bus 160 and includes a Y-line selector 172 response to a Y-line address conveyed on bus 170. A $V_{pp}$ source 202 provides the programming voltage for the sub-array 152. Each of the other three sub-arrays are structured similarly. In particular, sub-arrays 154, 156, 158 include respectively an X-line selector 164, 166, 168 and a Y-line selector 174, 176, 178. Each of the four sub-arrays is associated with a different data bit. Sub-array 152 is used to store data corresponding to DATA 1 conveyed on bus 173, while memory sub-arrays 154, 156, 158 are associated respectively with DATA 2 conveyed on bus 175, DATA 3 conveyed on bus 177, and DATA 4 conveyed on bus 179. Each of the four sub-arrays, 152, 154, 156, 158, includes a respective group enable signal. Specifically, a GROUP 1 ENABLE signal is conveyed on node 163 to the X-line selector 162, a GROUP 2 ENABLE signal is conveyed on node 165 to the X-line selector 164, a GROUP 3 ENABLE signal is conveyed on node 167 to X-line selector 166, and a GROUP 4 ENABLE signal is conveyed on node 169 to X-line selector 168.

These four group enable signals are generated by a group control circuit 220, which receives a read/write control signal and other control signal(s). When reading, all four sub-array groups are enabled so that all four data bits (DATA 1, DATA 2, DATA 3, and DATA 4) are simultaneously read from its respective sub-array group. However, when writing, each sub-array group is enabled sequentially to write at any one time fewer sub-arrays than are read during a read operation. The GROUP 1 ENABLE signal is driven to write the DATA 1 bit (or bits in certain embodiments) into sub-array 152. Likewise, the DATA 2 bit (or bits) are written into sub-array 154 when the GROUP 2 ENABLE signal is activated, and similarly with the GROUP 3 ENABLE and GROUP 4 ENABLE signals. During each of these four write cycles, one or more bits are preferably written into a single sub-array. Assuming the leakage current through unselected memory cells of the sub-array has a magnitude of I amps/bit written (as described above), and further assuming a write cycle time of ΔT seconds for each of the four sub-arrays, the total electronic charge (i.e., Q) wasted during the writing of these four bits (i.e., 1 bit at a time into each of four sub-arrays) is:

$$Q_{4\ sub-arrays}=(4\ cycles)\cdot I\cdot \Delta T = 4\cdot I\cdot \Delta T$$

In contrast, if these same four bits were written one bit at a time into a single sub-array that is four times as large, the leakage current through unselected memory cells of the sub-array has a magnitude of 4I amps/bit written. The write cycle time to write each bit is still ΔT seconds, thus the total electronic charge (i.e., Q) wasted for this case (i.e., 1 bit at a time, but 4 total bits into a larger sub-array) is:

$$Q_{1\ sub-array}=(4\ cycles)\cdot 4I\cdot \Delta T = 16\cdot I\cdot \Delta T$$

Alternatively, a single write cycle could be used to write all four bits simultaneously into this larger sub-array. In such a case the electronic charge wasted during the single write cycle is only 4·I·ΔT, but the programming current through the selected memory cells would now be four times larger than when programming a single memory cell.

By dividing what would have been a larger memory array into four sub-arrays, and by writing only one of the four sub-arrays at any one time, the leakage current through the unselected memory cells is reduced by a factor of four. Four write cycles, each with a lower amount of current required of the programming voltage source $V_{pp}$ are performed to write the four data bits into the memory array. Consequently, the write power is reduced without negatively impacting the read bandwidth, although obviously the write time is now lengthened. In certain devices, particularly one-time programmable memory devices, such an increased writing time may not be a significant detriment to the desirability of the device, particularly when the programming current may be decreased so substantially. Moreover, it is difficult to program more than 1 bit per write cycle (e.g., providing a higher current at the programming voltage to write more than one memory cell per write cycle; interaction of one memory cell, once programmed, with other memory cells not yet completely programmed), and thus it is advantageous to break up an array or sub-array into smaller sub-arrays for this reason as well.

In the embodiment shown in FIG. 2 each of the sub-arrays 152, 154, 156, 158 includes a respective programming voltage source 202, 204, 206, 208. In the write cycle just described, only one of these $V_{pp}$ sources is active at any given time during the writing of its respective sub-array. Alternatively, a single $V_{pp}$ source could be provided and shared among all four sub-arrays.

By subdividing a memory array into, in this case, four sub-arrays, the length of each X-line and Y-line is decreased. Consequently, the voltage drops arising from the resistance of the X-lines and the Y-lines is reduced which results in a greater voltage differential across a selected memory cell during programming. Since the time to program an antifuse within the memory cell decreases rapidly (e.g., by a factor of ten or more) with each volt change in the programming voltage, much faster programming of the antifuses is possible. If a memory array is divided into N sub-arrays, the number of write cycles necessary to write the N sub-arrays increases by a factor of N, but the leakage current during each such operation is decreased by a factor of N also. Moreover, each of the N write cycles is shorter (because the memory cells program faster) with the net result being less write energy expended. Therefore, the total energy to write an equal number of bits is lower.

Figure 3:
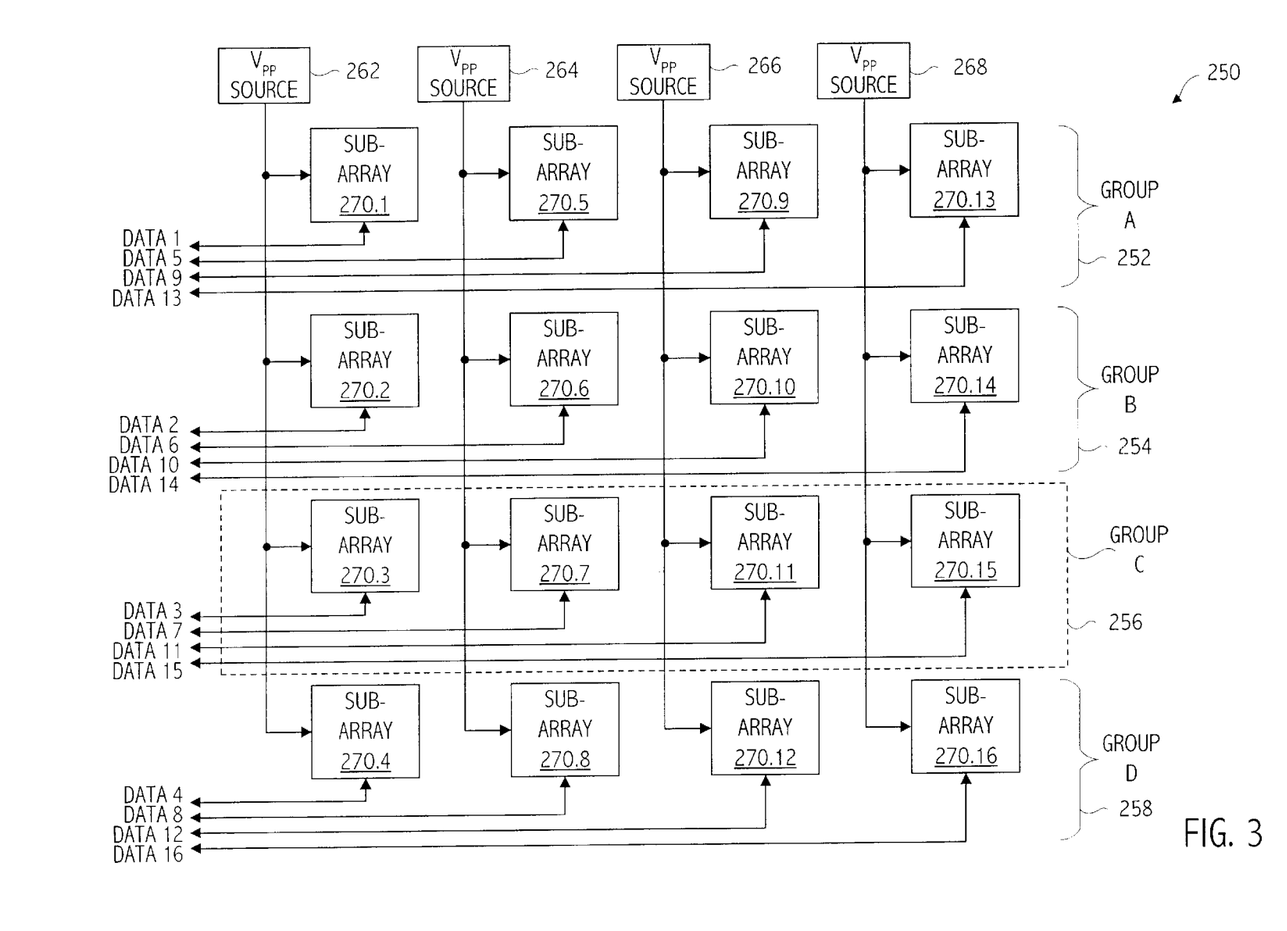
FIG. 3 is a block diagram of a memory array of a preferred embodiment which includes four groups of sub-arrays, each group containing four sub-arrays.

Referring now to FIG. 3, a memory array 250 is shown which includes four groups of sub-arrays, each group containing four sub-arrays. Group A of sub-arrays (labeled 252) encludes a sub-array 270.1 for storing DATA 1, a sub-array 270.5 for storing DATA 5, a sub-array 270.9 for storing DATA 9, and a sub-array 270.13 for storing DATA 13. Likewise, a Group B of sub-arrays (labeled 254) includes four sub-arrays 270.2, 270.6, 270.10, and 270.14 for storing, respectively, DATA 2, DATA 6, DATA 10, and DATA 14. A Group C of sub-arrays (labeled 256) includes four sub-arrays 270.3, 270.7, 270.11, and 270.15 for storing, respectively, DATA 3, DATA 7, DATA 11, and DATA 15. Lastly, a Group D of sub-arrays (labeled 258) includes four sub-arrays 270.4, 270.8, 270.12, and 270.16 for storing, respectively, DATA 4, DATA 8, DATA 12, and DATA 16. Four $V_{pp}$ sources 262, 264, 266, and 268 are provided, and which are shared among corresponding sub-arrays within each of the four groups. For example, $V_{pp}$ source 262 is connected to and shared by sub-arrays 270.1, 270.2, 270.3, and 270.4. In other words, in this embodiment a number of $V_{pp}$ sources are provided which is equal to the number of sub-arrays within each of the sub-array groups. When a particular group is enabled for writing, each of the $V_{pp}$ sources is utilized to provide the programmed voltage to its respective sub-array, and the other sub-arrays in the three other groups that are not enabled for write do not add significant additional load to the $V_{pp}$ sources. During a read operation, all four groups 252, 254, 256, and 258 are preferably enabled such that all sixteen data bits may be read in parallel. To write the sixteen data bits, however, four sequential write cycles are preferably carried out internally during each of which four bits are written into the corresponding group of sub-arrays. The illustration in FIG. 3 is directed toward the data organization and grouping of sub-arrays, and consequently the various group enable and other control signals are not shown.

Figure 4:
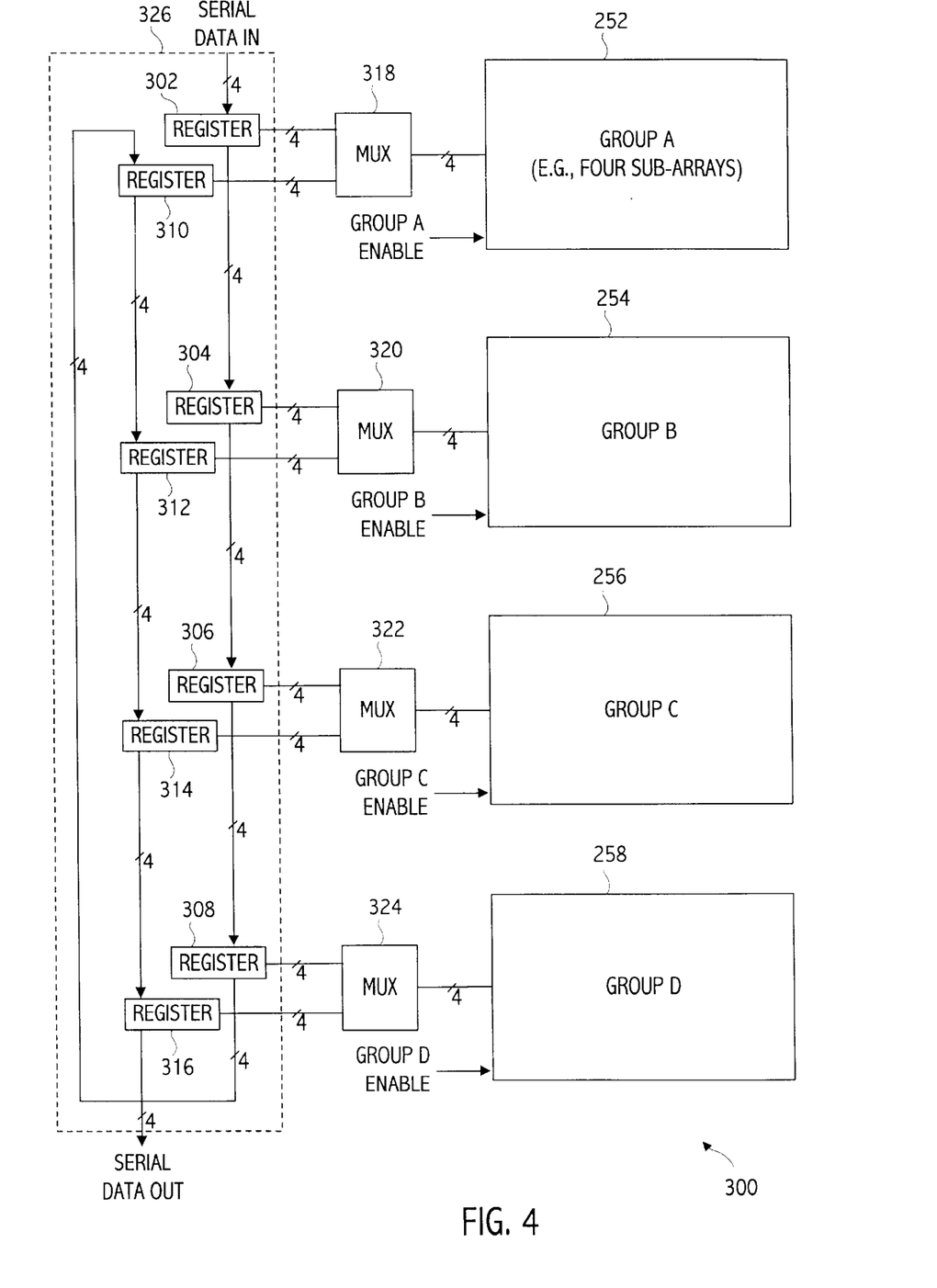
FIG. 4 is a block diagram of a memory device of a preferred embodiment which includes several registers for communicating data to and from each of four groups of sub-arrays.

Referring now to FIG. 4, four groups of sub-arrays 252, 254, 256, and 258 are shown, analogous to those shown in FIG. 3. A large data register 326 is provided where data I/O is temporarily stored and can be sequentially read in and out. As shown in FIG. 4, this register is formed by serially-connected registers 302, 304, 306, 308, 310, 312, 314, and 316. As described in the previous figure, all four sub-array groups may be simultaneously enabled during a read operation to read sixteen bits of data collectively out of the four groups. The four bits of data from group 252 may be stored in register 302 while the respective four bits of data from respective groups 254, 256, and 258 may be stored within registers 304, 306, and 308. During a subsequent read operation, sixteen additional bits of information may be read from the four groups simultaneously with the respective four bits from respective groups 252, 254, 256 and 258 stored into registers 310, 312, 314, and 316 by operation of the respective multiplexers 318, 320, 322, and 324. As such, the data register 326 can be much larger than the number of sub-arrays within the memory array. An advantageous size for such a register is 512 bytes.

To write data into the various groups of sub-arrays, each group is enabled sequentially to write four bits at a time. For example, after loading all of the registers 302–316, the four bits within register 302 may be steered by MUX 318 to group 252 and written therein by activating a GROUP A ENABLE signal. Next, the four bits within register 304 may be written into group 254. After eight such write cycles, each of the four bits within each of the registers 302–316 are all written into the four groups 252, 254, 256, 258. In this particular example, when reading data from the sub-arrays, two consecutive read operations provide sufficient data into each of the registers while eight different write cycles are necessary to write the data within each register into its corresponding sub-array group. In an alternative embodiment, both sub-array group 252 and sub-array group 254 could be written at the same time during one write cycle and sub-array group 256 and sub-array group 258 written at the same time during a different write cycle, resulting in each read operation corresponding to two (preferably sequential) write cycles to write the same number of bits. In a preferred embodiment, the number of sub-arrays implemented is less than the register 326 size, and multiple bits are written into each sub-array by multiple write cycles for each sub-array group before going on to the next sub-array group. For example, the data within register 302 might be written into group 252 during one write cycle, and the data within register 310 written into group 252 during the subsequent write cycle before moving on to storing data into any of the other three groups 254, 256, and 258.

Figure 5:
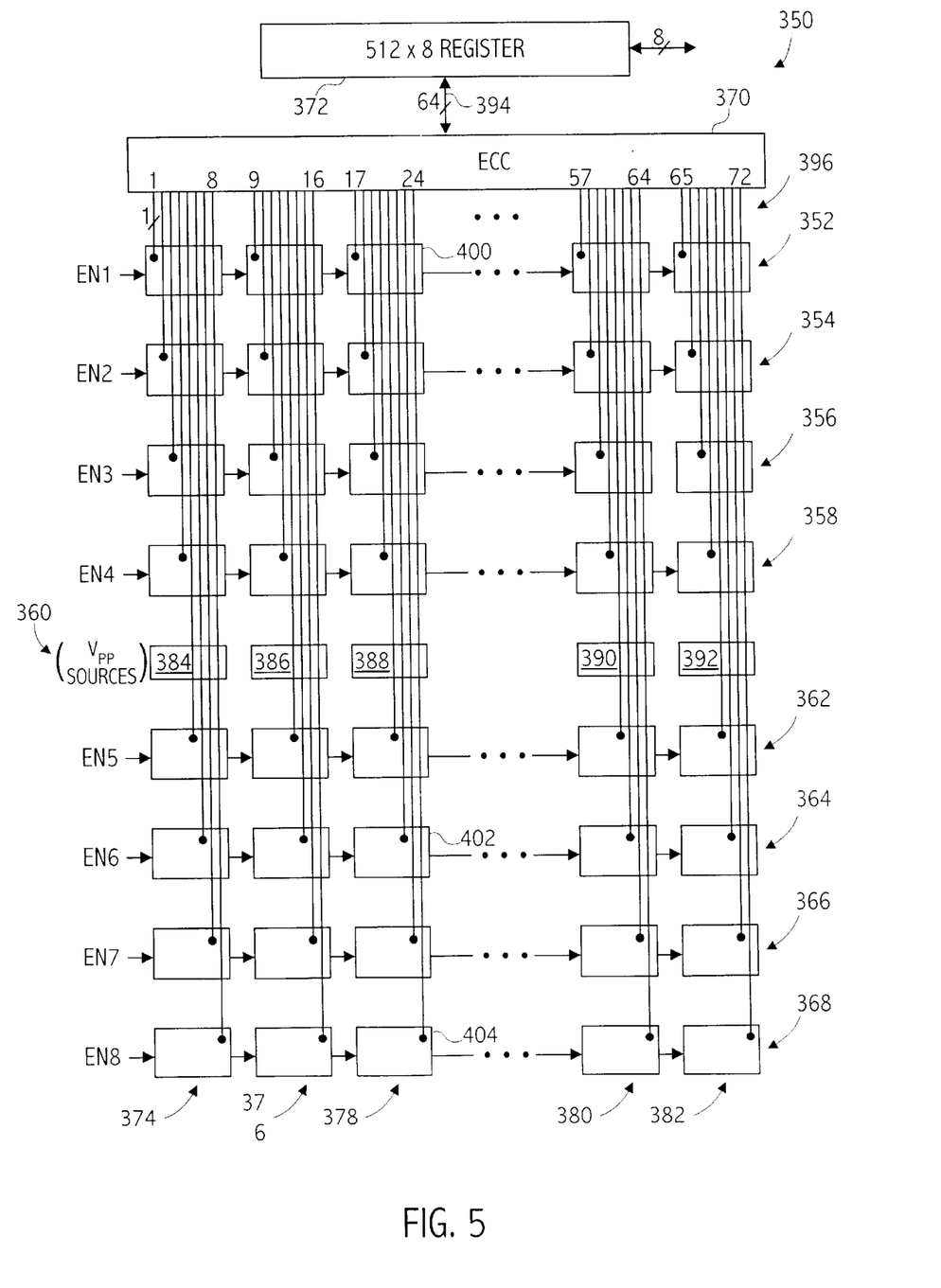
FIG. 5 is a block diagram of a preferred embodiment of a memory array which includes eight groups of nine sub-arrays each, and nine programming voltage sources shared by the eight groups of sub-arrays.

Referring now to FIG. 5, a memory array architecture 350 is depicted which includes a 512×8 register 372 which communicates via a 64-bit bus 394 to an ECC unit 370. A word having 64 bits of user data is tagged with an additional 8 ECC (i.e., error checking and correction) "syndrome" bits to form a 72-bit ECC word. Algorithms for generating ECC syndrome bits and for checking and correcting the user data bits are well known in the art. Seventy-two sub-arrays are provided, grouped into eight sub-array groups 352, 354, 356, 358, 362, 364, 366, and 368. Each of the 72 sub-arrays preferably stores one bit of a contiguous 72-bit ECC word. Such an organization is additionally described in copending, commonly-assigned application Ser. No. 09/747,574 filed on even date herewith, entitled "Three-Dimensional Memory Array and Method for Storing Data Bits and ECC Bits Therein" and naming Thomas H. Lee, James M. Cleeves; and Mark G. Johnson as inventors.

For example, the sub-arrays shown in the first column of sub-arrays (labeled column 374) may be assumed to store data bits DATA 1 through DATA 8, while the sub-arrays within column 376 may be assumed to store data bits DATA 9 through DATA 16. Similarly, the sub-arrays within column 378 may be assumed to store data bits DATA 17 through DATA 24, leading up to the sub-arrays within column 380 may be assumed to store the data bits DATA 57 through DATA 64. The ninth column of sub-arrays, labeled 382, may then be assumed to convey data bits DATA 65 through DATA 72 which may be viewed as the ECC bits for the remaining 64 bits read from the array. Such an organization is convenient, but by no means required, for each of the 72 bits comprising the ECC word may be physically mapped to any of the 72 bits within the memory array itself. Nonetheless, for ease of discussion without loss of generality, one can assume that the ninth column 382 of sub-arrays stores the ECC syndrome bits for the remaining 64 bits stored within the other eight columns of sub-arrays within the memory array. A group of $V_{PP}$ sources 360 is also depicted which are shared among the eight sub-array groups. Specifically, the $V_{PP}$ source 384 is shared by those sub-arrays within column 374 (i.e., one corresponding sub-array in each of eight sub-array groups), while the $V_{PP}$ sources 386, 388, 390, and 392 are shared respectively by those sub-arrays within respective columns 376, 378, 380, and 382. While the group 360 of shared VPP sources is depicted as if located generally in the center of the array, the VPP sources may be alternatively located at the edge of the array, or even apart from the array.

The arrangement depicted in FIG. 5 is a simplified conceptual embodiment to particularly highlight an organization which associates each single bit within a 72-bit ECC word with a separate sub-array within the memory array. These 72 bits are conveyed by a 72-bit array bus (labeled 396) into and out of the ECC unit 370. The desired read bandwidth through the ECC unit 370 is equal to the bandwidth of the array bus 396 connecting each of the sub-arrays to the ECC unit 370.

The nine sub-arrays within sub-array group 352 are enabled to write by a group enable signal EN1, which is conveyed to each of the nine sub-array blocks therewithin. Consequently, these nine sub-arrays are written simultaneously while the remaining 63 sub-arrays are preferably prevented from writing their respective data bits until each of seven subsequent write cycles. Similarly, the respective nine sub-arrays within each of groups 354, 356, 358, 362, 364, 366 and 368 are respectively enabled by group enable signals EN2, EN3, EN4, EN5, EN6, EN7, and EN8.

Figure 6:
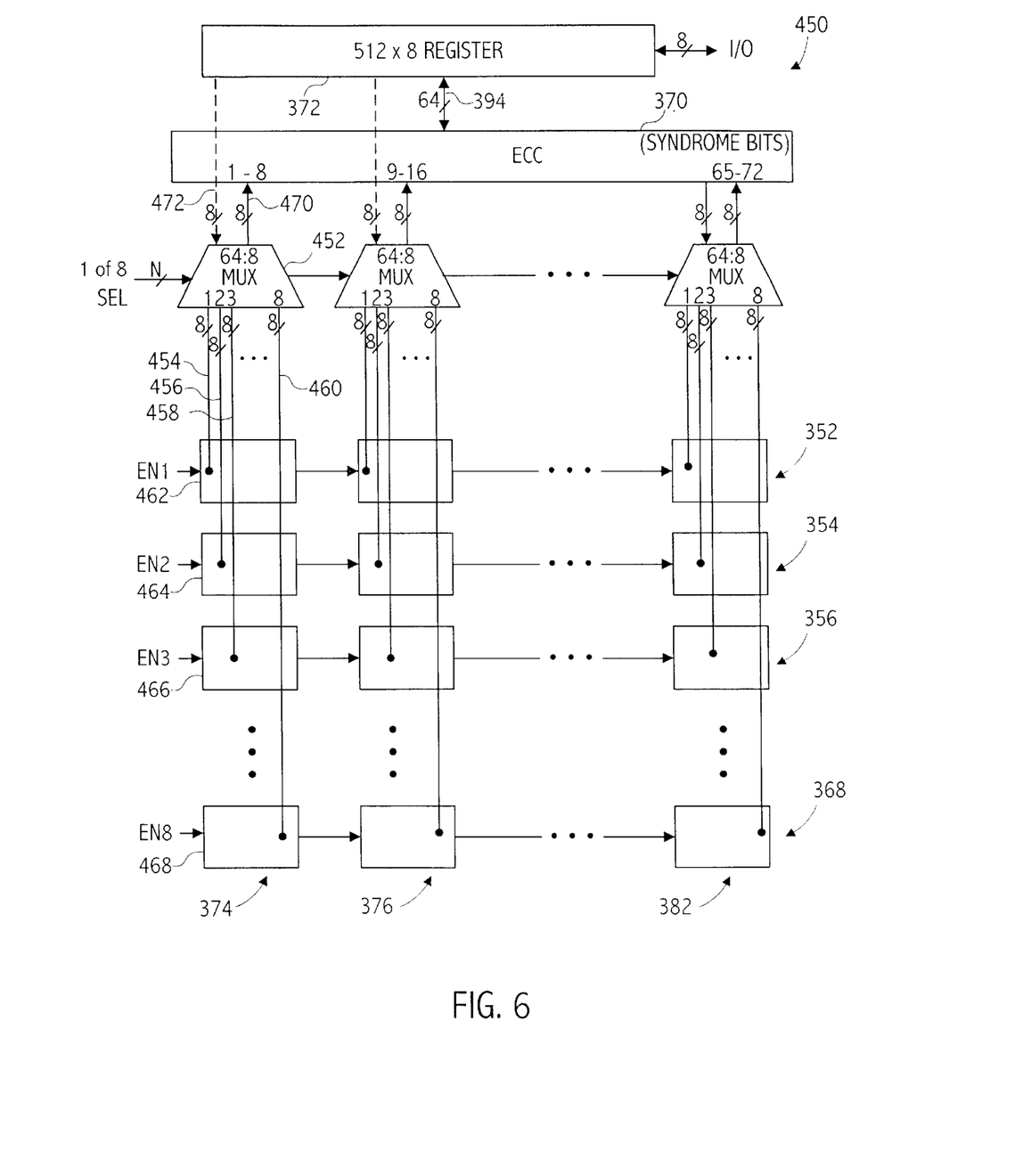
FIG. 6 is a block diagram of another preferred embodiment of a memory array including several multiplexers interfacing various data lines of a data path to and from the memory array to an on-chip ECC unit.

Referring now to FIG. 6, a preferred embodiment of a memory architecture is depicted which provides for a cycle time in the memory array itself which is eight times slower than the cycle time through an error correction unit and thus at least eight times slower than the cycle time for writing into a externally accessible data register. This embodiment is particularly well suited to implementation using a three-dimensional programmable, write-once memory array structure, although implementation using other kinds of memory cells is also advantageous.

Compared to the conceptual implementation depicted in FIG. 5, the implementation in FIG. 6 expands the 1-bit data bus from each of the sub-arrays into an 8-bit bus. Within each column of sub-arrays, a 64 to 8 MUX selects which eight bits to forward to the ECC unit. Each of the selected bits may correspond to a different sub-array (i.e., somewhat like FIG. 5). Alternatively, each of the selected bits may all be located within the same sub-array (in which case the MUX steers the entire bus from a given sub-array to the ECC unit), or the selected bits may be grouped, such as two selected bits per sub-array. As before, eight sub-array groups are represented, four of which are specifically depicted in FIG. 6, with it being understood that eight sub-array groups of nine sub-arrays each are represented in the figure, as was depicted also in FIG. 5. Of course, memory arrays with other numbers of sub-arrays are also contemplated. Many of the details of this embodiment may be described in the context of column 374. Each of the sub-arrays within column 374 (being sub-arrays 462, 464, 466, . . . 468) is associated with a corresponding 8-bit bus 454, 456, 458, . . . 460, each of which is coupled to a 64-to-8 multiplexer 452. During a read operation, each of the eight sub-arrays 462, 464, 466 . . . 468 simultaneously conveys eight bits of data to a corresponding input of MUX 452. A 1-of-8 select signal is also conveyed to the MUX 452 which selects eight of the 64 bits presented to the MUX 452 (the eight bits preferably being selected such that each selected bit corresponds to a different sub-array), which eight bits are provided on bus 470 and conveyed to the ECC unit 370.

During the next sequential read cycle, the 64 data outputs from the sub-arrays within column 374 remain quiescent and the 1-of-8 select signal provided to MUX 452 is changed to select a different group of eight data bits (the eight bits still preferably being selected such that each selected bit corresponds to a different sub-array) and to convey those eight new bits to the ECC unit on bus 470. Consequently, when reading, the eight-bit buses from the sub-arrays to the multiplexers (i.e., the array data path, or array bus) operate with a cycle time eight times longer than the cycle time of the 1-of-8 select signal and likewise the cycle time of the bus 470 to the ECC unit 370. The array data bus may conveniently be operated with a 1–5 microsecond cycle time, while the 1-of-8 select signal and the multiplexed bus 470 may advantageously be operated with a 70–350 nanosecond cycle time, after completion of an array data bus cycle to retrieve on buses 454, 456, . . . 460 all 64 bits from column 374.

During a write, the 1-of-8 select signal is cycled at a slow cycle time (e.g., from 1–40 microseconds) to preferably convey 8 data bits received on bus 472 to a group of eight selected bus lines and to the corresponding sub-array group(s). Preferably the eight selected bus lines correspond to a single selected bus line within each of the eight 8-bit array buses 454, 456, . . . 460, and consequently each of the eight bits is stored into a different sub-array within column 374, although other organizations are contemplated. The group enable signals EN1–EN8 are preferably cycled, as described above with respect to FIG. 5, to write each of the data bits into each group one group at a time. The write data conveyed by bus 472 is also conveyed by bus 394 to the ECC unit 370 for calculating the eight ECC syndrome bits (corresponding to bits 65–72) to be stored in column 382.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular memory cell technology, or to any particular arrangement of sub-arrays. In particular, even though the preferred embodiments are described in the context of a passive element memory array, the teachings of the present invention are believed advantageous for use with other types of memory cells, such as certain 3-terminal memory cells. Moreover, while certain embodiments have been described in the context of a three-dimensional, field-programmable, write once memory array, it should be appreciated that such an array is not necessarily required unless specifically enumerated in a particular claim. Accordingly, other embodiments, variations, and improvements not described herein are not necessarily excluded from the scope of the invention, which is defined by the following appended claims.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may increase when the memory cell incorporates a fuse technology, or may decrease when the memory cell incorporates an antifuse technology. A passive element memory array is not necessarily a one-time programmable (i.e., write once) memory array.

Certain passive element memory cells incorporate layers of organic materials including at least one layer that has a diode-like characteristic conduction and at least one organic material that changes conductivity with the application of an electric field.

A data set, as used herein, is a related group of data bits which are logically written together and logically read together. As an example, a 64-bit word conveyed to a memory array for writing into the array may be viewed as a data set.

In certain contexts, a write "cycle" may be synonymous with a write "operation." However, when viewed at the boundary of a memory array or memory device, a single external write "cycle" may actually cause several internal write "cycles" or "operations" to be sequentially performed at the memory array level, each writing data to a different group of memory cells. Unless the context so requires, a write cycle referred to herein is an internal write cycle or operation performed at the array level.

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level. A high logic level is frequently referred to as a logic "1" and a low logic level is frequently referred to as a logic "0" (at least for positive logic).

Frequently logic signals are named in a fashion to convey which level is the active level. For example, CLKEN is commonly used to name an active-high clock enable signal, because the true polarity is implied in the name. Conversely, CLKENB, /CLKEN, CLKEN#, CLKEN*, CLKEN_L, CLKEN_C, or #CLKEN are commonly used to name an active-low clock enable signal, because one of the many common expressions indicating the complement polarity is used in the name. Complementary pairs of signals or node names, such as true and complement clock lines, and true and complement bit lines within a column of a memory array, are frequently named to clarify the polarity of both nodes or signals (e.g., BL3T and BL3C; BL6_T and BL6_C) and in other instances, only the complement polarity may e indicated in the names (e.g., CLK and CLK#, or BL and BLB). In still other cases, wo "complementary" signals are both inactive at one state (e.g., both inactive low), and only one is driven to an active level to convey the polarity of the signal. For example, two complementary address lines (e.g., A2T and A2C) may be both inactive low during a quiescent portion of a cycle. Later, A2T is driven high to indicate that the received address A2 is high (A2=H). Alternatively, A2C is driven high to indicate that the address received is low (A2=L). It is to be appreciated by those skilled in the art that these and other similar phrases may be used to name the signals and nodes. The schematic diagrams and accompanying description of the signals and nodes should in context be clear.

A transistor may be conceptualized as having a control terminal which controls the flow of current between a first current handling terminal (or current carrying terminal) and a second current handling terminal. An appropriate condition on the control terminal causes a current to flow from/to the first current handling terminal and to/from the second current handling terminal (for typical operating voltages of the first and second current handling terminals). In a bipolar NPN transistor, the first current handling terminal may be deemed the emitter, the control terminal deemed the base, and the second current handling terminal deemed the collector. A sufficient base current into the base causes a collector-to-emitter current to flow (for typical collector-to-emitter operating voltages). In a bipolar PNP transistor, the first current handling terminal may be deemed the emitter, the control terminal deemed the base, and the second current handling terminal deemed the collector. A sufficient base current exiting the base causes an emitter-to-collector current to flow (for typical collector-to-emitter operating voltages).

An MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficiently high voltage on the gate (relative to the source voltage) causes a current to therefore flow from the drain to the source (provided the respective voltage of the drain and source are different). For an enhancement mode N-channel device, a positive gate-to-source voltage greater than the threshold voltage (including body effect) is sufficient. The source voltage referred to in N-channel MOS device equations merely refers to whichever current handling terminal has the lower voltage at any given point in time. For example, the "source" of the N-channel device of a bi-directional CMOS transfer gate depends on which side of the transfer gate is at the lower voltage. To reflect this symmetry of most N-channel MOS transistors, the control terminal may be deemed the gate, the first current handling terminal may be termed the "drain/source", and the second current handling terminal may be termed the "source/drain". Such a description is equally valid for a P-channel MOS transistor, since the polarity between drain and source voltages, and the direction of current flow between drain and source, is not implied by such terminology. Alternatively, one current handling terminal may arbitrarily deemed the "drain" and the other deemed the "source", with an implicit understanding that the two are not distinct, but interchangeable.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

Generalizing somewhat, the first power supply terminal is frequently named "VDD", and the second power supply terminal is frequently named "VSS." Both terms may appear either using subscripts (e.g., $V_{DD}$) or not. Historically the nomenclature "$V_{DD}$" implied a DC voltage connected to the drain terminal of an MOS transistor and $V_{ss}$ implied a DC voltage connected to the source terminal of an MOS transistor. For example, old PMOS circuits used a negative VDD power supply, while old NMOS circuits used a positive VDD power supply. Common usage, however, frequently ignores this legacy and uses VDD for the more positive supply voltage and VSS for the more negative (or ground) supply voltage unless, of course, defined otherwise. Describing a circuit as functioning with a "VDD supply" and "ground" does not necessarily mean the circuit cannot function using other power supply potentials. Other common power supply terminal names are "VCC' (a historical term from bipolar circuits and frequently synonymous with a +5 volt power supply voltage, even when used with MOS transistors which lack collector terminals) and "GND" or just "ground."

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. Accordingly, other embodiments, variations, and improvements not described herein are not necessarily excluded from the scope of the invention, which is defined by the following appended claims.

What is claimed is:

1. An integrated circuit comprising:
    a memory array comprising a plurality of sub-arrays configured as a plurality M of sub-array groups, each group comprising N sub-arrays, said memory array configured to enable, when writing data into the memory array, fewer sub-array groups than are enabled for reading data from the memory array.

2. The integrated circuit as recited in claim 1 further comprising:
    a plurality M of group enable signals, each associated with a respective sub-array group for enabling at least one sub-array therewithin, whether reading or writing, said group enable signals being generated to enable fewer sub-array groups when writing data into the memory array than when reading data from the memory array.

3. The integrated circuit as recited in claim 2 wherein:
    each of the plurality M of group enable signals is configured to enable all sub-arrays within the respective sub-array group, whether reading or writing.

4. The integrated circuit as recited in claim 2 wherein:
    at most only one sub-array group is enabled by its associated group enable signal when writing data.

5. The integrated circuit as recited in claim 2 wherein:
    at least two sub-array groups are simultaneously enabled, each by its associated group enable signal, when writing data.

6. The integrated circuit as recited in claim 1 wherein:
    M is equal to 4; and
    N is equal to 4.

7. The integrated circuit as recited in claim 1 wherein:
    M is equal to 8; and
    N is equal to 9.

8. The integrated circuit as recited in claim 1 wherein each sub-array group is configured, when enabled for writing, such that:
    at most only one bit of data is simultaneously written into any sub-array of the respective enabled sub-array group; and
    more than one sub-array within the respective enabled sub-group is enabled to write an associated data bit therewithin.

9. The integrated circuit as recited in claim 1 further comprising:
    a plurality N of write voltage generator circuits, each associated with a corresponding sub-array within each sub-array group.

10. The integrated circuit as recited in claim 1 wherein:
    the memory array comprises a passive element memory array.

11. The integrated circuit as recited in claim 1 wherein:
    the memory array comprises an erasable passive element memory array.

12. The integrated circuit as recited in claim 1 wherein:
    the memory array comprises a write once passive element memory array.

13. The integrated circuit as recited in claim 1 wherein:
    the memory array comprises a three-dimensional write once passive element memory array.

14. The integrated circuit as recited in claim 1 wherein:
    the memory array comprises a three-dimensional erasable passive element memory array.

15. The integrated circuit as recited in claim 1 wherein:
    the memory array is organized to associate a data set with a predetermined number of sub-array groups, with a corresponding portion of the data set associated with each corresponding sub-array within the predetermined number of sub-array groups; and
    at most one sub-array group is selected at any time to write into at least one sub-array of the selected group a corresponding portion of the data set.

16. The integrated circuit as recited in claim 1 wherein N is equal to 1.

17. The integrated circuit as recited in claim 1 wherein N is greater than 1.

18. The integrated circuit as recited in claim 1 wherein:
the memory array is organized to associate a data set with a predetermined number of sub-array groups, with a corresponding portion of the data set associated with each corresponding sub-array within the predetermined number of sub-array groups; and
the corresponding portion of the data set associated with each corresponding, sub-array within the predetermined number of sub-array groups comprises at most a single bit of data.

19. The integrated circuit as recited in claim 1 wherein:
the memory array is organized to associate a data set with a predetermined number of sub-array groups, with a corresponding portion of the data set associated with each corresponding sub-array within the predetermined numnber of sub-array groups; and
the corresponding portion of the data set associated with each corresponding sub-array within the predetermined number of sub-array groups comprises at most up to eight bits of data.

20. The integrated circuit as recited in claim 1 wherein the memory array is organized to associate a data set with a predetermined number of sub-array groups, with a corresponding portion of the data set associated with each corresponding sub-array within the predetermined number of sub-array groups, said integrated circuit further comprising:
means for selecting at least one but less than the predetermined number of groups to simultaneously write into at least one sub-array of the selected at least one group a corresponding portion of the data set;
means for cycling through additional sub-array groups, selecting at any time at least one but less than the predetermined number of groups, to simultaneously write into at least one sub-array of each selected additional group a corresponding portion of the data set, until all the predetermined number of groups have been selected, and the complete data set written into the predetermined number of sub-array groups; and
means for selecting all of the predetermined number of sub-array groups to simultaneously read from each corresponding sub-array within the predetermined number of sub-array groups a corresponding portion of the data set, thereby reading simultaneously the data set.

21. The integrated circuit as recited in claim 20 wherein the memory array comprises a passive element memory array.

22. The integrated circuit as recited in claim 20 wherein the memory array comprises an erasable passive element memory array.

23. The integrated circuit as recited in claim 20 wherein the memory array comprises a write once passive element memory array.

24. The integrated circuit as recited in claim 20 wherein the memory array comprises a three-dimensional write once passive element memory array.

25. The integrated circuit as recited in claim 20 wherein the memory array comprises a three-dimensional erasable passive element memory array.

26. The integrated circuit as recited in claim 20 wherein at most one sub-array group is selected at any time to write into at least one sub-array of the selected group a corresponding portion of the data set.

27. The integrated circuit as recited in claim 20 wherein each sub-array group comprises a plurality of sub-arrays.

28. The integrated circuit as recited in claim 20 wherein each sub-array group comprises one sub-array.

29. The integrated circuit as recited in claim 20 wherein the corresponding portion of the data set associated with each corresponding sub-array within the predetermined number of sub-array groups comprises a single bit of data.

30. The integrated circuit as recited in claim 20 wherein the corresponding portion of the data set associated with each corresponding sub-array within the predetermined number of sub-array groups comprises up to eight bits of data.

31. The integrated circuit as recited in claim 1 wherein the memory array is organized to associate a data set with a predetermined plurality of sub-array groups, with a corresponding portion of the data set associated with each corresponding sub-array within the predetermined plurality of sub-array groups, said integrated circuit further comprising:
means for cycling through each sub-array group of the predetermined plurality, selecting at any time one such group to simultaneously write into each sub-array of the selected group a corresponding portion of the data set, until all the predetermined plurality of groups have been selected, and the complete data set written into the predetermined plurality of sub-array groups; and
means for selecting all of the predetermined plurality of sub-array groups to simultaneously read from each corresponding sub-array within the predetermined plurality of sub-array groups a corresponding portion of the data set, thereby reading simultaneously the data set from the memory array.

32. The integrated circuit as recited in claim 31 wherein the memory array comprises a passive element memory array.

33. The integrated circuit as recited in claim 31 wherein the memory array comprises an erasable passive element memory array.

34. The integrated circuit as recited in claim 31 wherein the memory array comprises a write once passive element memory array.

35. The integrated circuit as recited in claim 31 wherein the memory array comprises a three-dimensional write once passive element memory array.

36. The integrated circuit as recited in claim 31 wherein the memory array comprises a three-dimensional erasable passive element memory array.

37. The integrated circuit as recited in claim 31 wherein the corresponding portion of the data set associated with each corresponding sub-array within the predetermined plurality of sub-array groups comprises a single bit of data.

38. The integrated circuit as recited in claim 31 wherein the corresponding portion of the data set associated with each corresponding sub-array within the predetermined plurality of sub-array groups comprises up to eight bits of data.

39. The integrated circuit as recited in claim 1 wherein the memory array comprises a programmable memory array organized to associate a data set with a predetermined number of sub-arrays within one or more sub-array groups, with a corresponding portion of the data set associated with each corresponding sub-array within the predetermined number of sub-arrays, said integrated circuit further comprising:
means for writing the data set by using a plurality of internal write cycles, each writing a respective portion of the data set simultaneously into the associated sub-arrays, thereby reducing programming power while writing the data set into the memory array; and means for reading the data set using a single internal read cycle to simultaneously access all the predetermined number of sub-arrays, thereby preserving read bandwidth while reading the same data set from the memory array.

40. The integrated circuit as recited in claim 39 wherein the means for writing is configured to write data into at most one sub-array at a time.

41. The integrated circuit as recited in claim 39 wherein the corresponding portion of the data set associated with each corresponding sub-array comprises a single bit of data.

42. The integrated circuit as recited in claim 39 wherein the corresponding portion of the data set associated with each corresponding sub-array comprises up to eight bits of data.

43. The integrated circuit as recited in claim 1 further comprising:
   means for selecting a first set of one or more sub-array groups to simultaneously write data associated therewith into the sub-arrays of the first set;
   means for selecting a second set of one or more sub-array groups to simultaneously write data associated therewith into the sub-arrays of the second set; and
   means for selecting both the first set and second set of sub-array groups to read data simultaneously from both sets.

44. The integrated circuit as recited in claim 43 wherein the first set and the second set each respectively comprises a single group of sub-arrays.

45. The integrated circuit as recited in claim 43 wherein the first set and the second set comprise different numbers of sub-array groups.

46. The integrated circuit as recited in claim 43 wherein the first set and the second set comprise equal numbers of sub-array groups.

47. An integrated circuit comprising:
   a passive element memory array comprising a plurality of sub-arrays configured as a plurality M of sub-array groups, each group comprising N sub-arrays; and
   a plurality M of group enable signals, each associated with a respective sub-array group for enabling each sub-array therewithin, whether reading or writing, said group enable signals being generated to enable fewer sub-array groups when writing data into the memory array than when reading data from the memory array.

48. The integrated circuit as recited in claim 47 wherein:
   at most only one sub-array group is enabled by its associated group enable signal when writing data.

49. The integrated circuit as recited in claim 47 wherein:
   at least two sub-array groups are simultaneously enabled, each by its associated group enable signal, when writing data.

50. The integrated circuit as recited in claim 47 wherein:
   M is equal to 4; and
   N is equal to 4.

51. The integrated circuit as recited in claim 47 wherein:
   M is equal to 8; and
   N is equal to 9.

52. The integrated circuit as recited in claim 47 wherein:
   N is equal to 1.

53. The integrated circuit as recited in claim 47 wherein each sub-array group is configured, when enabled for writing, such that:
   at most only one bit of data is simultaneously written into each sub-array of the respective enabled sub-array group.

54. The integrated circuit as recited in claim 47 further comprising:
   a plurality N of write voltage generator circuits, each associated with a corresponding one of the plurality N of sub-arrays within each sub-array group.

55. The integrated circuit as recited in claim 47 wherein:
   at most only one sub-array group is enabled by its associated group enable signal when writing data; and
   each sub-array group is configured, when enabled for writing, such that, at most, only one bit of data is simultaneously written into each sub-array of the respective enabled sub-array group.

56. The integrated circuit as recited in claim 47 wherein:
   the memory array comprises an erasable passive element memory array.

57. The integrated circuit as recited in claim 47 wherein:
   the memory array comprises a write once passive element memory array.

58. The integrated circuit as recited in claim 47 wherein:
   the memory array comprises a three-dimensional write once passive element memory array.

59. The integrated circuit as recited in claim 55 wherein:
   the memory array comprises a three-dimensional write once passive element memory array.

60. The integrated circuit as recited in claim 47 wherein:
   the memory array comprises a three-dimensional erasable passive element memory array.

61. The integrated circuit as recited in claim 47 wherein at most a single bit of data of a data set is associated with any one sub-array.

62. The integrated circuit as recited in claim 47 wherein up to eight bits of data of a data set are associated with any one sub-array.

* * * * *

UNITED STATES PATENT AND TRADEMARK OFFICE
CERTIFICATE OF CORRECTION

PATENT NO. : 6,661,730 B1
DATED : December 9, 2003
INVENTOR(S) : Scheuerlein et al.

It is certified that error appears in the above-identified patent and that said Letters Patent is hereby corrected as shown below:

Column 15,
Line 12, "each corresponding, sub-array" should read -- each corresponding sub-array --
Line 20, "numnber" should read -- number --

Signed and Sealed this

Twenty-seventh Day of April, 2004

JON W. DUDAS
*Acting Director of the United States Patent and Trademark Office*